INVENTOR:
FINIS E. GENTRY,
BY Urban H. Faubion
HIS ATTORNEY.

INVENTOR:
FINIS E. GENTRY,
BY Nelson H. Stauber [signature]
HIS ATTORNEY.

United States Patent Office 3,324,359
Patented June 6, 1967

3,324,359
FOUR LAYER SEMICONDUCTOR SWITCH WITH THE THIRD LAYER DEFINING A CONTINUOUS, UNINTERRUPTED INTERNAL JUNCTION

Finis E. Gentry, Skaneateles, N.Y., assignor to General Electric Company, a corporation of New York Filed Sept. 30, 1963, Ser. No. 312,382
6 Claims. (Cl. 317—235)

ABSTRACT OF THE DISCLOSURE

A solid state PNPN gate turn off switch is provided with improved turn off gain by introducing an internal layer-like region immediately adjacent an external emitter layer in between the external emitter layer and the next adjacent internal region to reduce the emitter efficiency.

This invention relates to semiconductor switches of the type which can be switched between two states of impedance, i.e., between a high impedance and a low impedance. In particular, the invention relates to such switches which can be changed from a state of low impedance to a state of high impedance and from a state of high impedance to a state of low impedance. Stated in another way, the invention relates to such semiconductor switches which can be changed from a highly conductive state to a much less conductive state (turned off) and also switched from the essentially non-conductive state to the highly conductive state (turned on). The invention is concerned with a semiconductor switching device of the four layer PNPN or NPNP type which has become known as a semiconductor gate turn-off switch (called a GTO).

Semiconductor switches have become an important component in a wide variety of control applications, particularly PNPN three terminal devices of the type frequently referred to as silicon controlled rectifiers. Operation of such devices is described in chapter 1 of the General Electric Controlled Rectifier Manual, second edition, copyright 1961 by the General Electric Company, the article by Moll, Tanenbaum, Goldey and Holonyak in Proceedings of the IRE, September 1956, volume 44, pages 1174 to 1182, and in the copending patent application, Ser. No. 838,504, entitled Semiconductor Devices and Methods of Making Same, filed Sept. 8, 1959 in the name of Nick Holoynak, Jr., and Richadd W. Aldrich and assigned to the assignee of the present application. The semiconductor switch is made an active element in the circuit by connecting two of its three terminals (its anode and cathode terminals) in the circuit to be controlled. With the switch in its "off" condition the rectifier acts as a high impedance element. Except for a very small leakage current, the switch acts as an open circuit. When the switch is in its "on" condition, it presents a very low impedance device (essentially a short circuit).

The usual mechanism for rendering the PNPN switches conductive is to introduce current into a third lead or terminal (called the gate lead) which increases the current flowing through the device and thereby renders the device conductive. This action is descriptively referred to as triggering the device or turning it on. When the device is triggered into the high conduction mode, the gate lead has very little control over the device and the only method of turning the device off is to reduce the current between the device anode and cathode (the main conduction path) below a given level called the holding current level.

These PNPN switch devices have been made extremely sensitive to triggering (turn on) injection current at the gate terminal. That is, they have been made so that an extremely small gate injection current can be used to change the device from its high impedance state to its high conduction mode. However, it has been extremely difficult to switch the device from its high conduction mode to the low conduction mode of operation utilizing current removal at the gate lead. A number of approaches to making the devices more sensitive to being turned off by gate current removal have been quite successful. For example, see the copending patent applications entitled Semiconductor Switch, Ser. No. 210,364, filed July 17, 1962 in the name of Nick Holonyak, Jr., and Richard W. Aldrich, now Patent No. 3,239,728, and Ser. No. 285,385 filed June 4, 1963, in the name of Joseph Moyson and James Petruzella (now issued as Patent 3,242,551) and both assigned to the assignee of the present invention. The present invention utilizes the teachings of these inventions but provides different structures to produce GTO's with a high sensitivity to turn-off signals.

To understand the gate turn off mechanism of the four layer PNPN switch it is necessary to understand a few of the operating principles and characteristics of 4 layer, 3 terminal switching elements. The operation of these devices is generally well understood. However, certain aspects of the operation of these devices is so crucial to an understanding of the present invention that a somewhat simplified physical description of the operation is given here.

The heart of the four layer switch is generally a pellet of monocrystalline semiconductor material such as silicon which has four layers of alternate conductivity type, i.e., 4 layers which alternately have an excess of positive holes (P type material) and an excess of negative electrons (N type material) with a barrier or junction between the layers. Thus, the device is called a PNPN or NPNP semiconductor device to describe the four layers of alternate conduction types. The switch (GTO or SCR) has a pair of main terminals each connected to one outer layer of the four layers and a gating terminal connected to one intermediate layer.

One of the easiest ways to understand the operating principles is to consider a 4 layer PNPN device (see FIGURE 1A) to consist of a PNP and an NPN transistor (FIGURES 1*b* and 1*c* respectively) with the center junction $J_c$ and the two center layers common to both transistors. The main current carrying terminals are connected to outer layers of the four layer device, therefore, each conceptual transistor has one of the main contacts connected to one outer layer. The 4 layer device has a gating terminal (gate lead $I_G$) connected to one of its internal layers, thus one of the conceptual transistors (PNP) has the gating terminal connected to its outer layer which is opposite the outer layer to which the main terminal is connected and the other conceptual transistor (NPN) has the gating terminal connected to its internal or base layer.

It is generally recognized that a semiconductor device consisting of two layers of different conductivity types (i.e., a PN device) readily conducts current in one direction but blocks current in the opposite direction. For example, if a voltage is applied across such a PN device which is positive at the P type layer and negative at the N type layer, the device readily conducts current whereas the device blocks current flow when the reverse voltage is applied. Simply stated, the reason the device readily conducts when a voltage is applied across it which is positive at the P type layer is that the positive voltage repels P type carriers at one end of the device and the negative voltage repels the negative electrons at the other end. Thus, the P and N type conduction carriers are moved toward and across the junction. With the opposite polarity applied, i.e., the junction reverse biased, the holes and electrons are attracted away from the junction. This forms a depletion region at the junction which is relatively free of both P and N type carriers. A charge appears across the depletion region (and junction), much as in a common capacitor, which opposes current flow. This condition can be broken down and current forced through the device by raising the reverse voltage to a sufficiently high value.

Now consider the PNPN device with a positive potential at the P type end layer and a negative potential at the N type end layer in the light of this discussion. It is seen that the junctions between the two outer end layer (at both ends) tend to conduct whereas the center junction, $J_c$, between the N and P type layers tends to block current flow through the device. In other words, each of our two conceptual transistors which make up the PNPN device has one juntcion which tends to block current flow through the device. Like the PN device discussed above, the PNPN device can be made to conduct by raising the voltage across it to some high value which forces conduction across the center junction $J_c$. It may also be made to conduct by introducing the proper amount of current through a gate lead on one of the intermediate layers to cause a change of the charge condition across the center junction $J_c$.

The total current flowing in the PNPN structure can be pictured as the sum of currents flowing in each of the individual conceptual transistor sections. Current flow in each section depends upon having current supplied to its base by the other section. That is to say that conduction of the PNP section depends on electron current from the end N type layer to the internal N type layer (base of the PNP transistor) and conduction of the NPN section depends upon flow of hole current from the end P layer to the internal P type layer (base of the NPN transistor). Without these currents the proper charge cannot be maintained across the center junction $J_c$ to support current flow.

Conditions for the device to be conducting can be stated in terms of the current gain of the individual sections. In fact, the concept of current gain $\alpha$ in each of the transistor sections (i.e., in each part of the total PNPN structure) is so fundamental to an understanding of turn off gain that a digression is made here to explain this concept. The current gain $\alpha$ is defined as the fraction of current injected at the emitter of each of the transistors which reaches the collector of that transistor. In other words, in the conceptual PNP transistor the current gain $\alpha_{pnp}$ defines the fraction of the current through the emitter (the end P type layer which has the positive voltage applied to it) which reaches the collector (i.e., the internal P type layer which is negatively biased). Thus $\alpha_{pnp}$ is defined by the ratio of the collector current to the emitter current and in this particular transistor section the predominant current flow is hole current. The current gain of the NPN conceptual transistor section, $\alpha_{npn}$ defines the fraction of current through the emitter (the end N type layer which is biased negatively) that reaches the collector (the internal N type region which is positively biased).

The total current of the device at the center junction $J_c$ is composed of the hole current from the end P region, the electron current from the end N region and a small leakage or thermally generated current. It is known that the device is highly conductive (on) when the sum of the current gain ($\alpha$'s) of the two transistor sections is unity and off or nonconductive when the sum of the current gains in the two transistor sections is less than unity, e.g., 0.9. The current gains ($\alpha_{pnp}$ and $\alpha_{npn}$) increase as the collector to emitter voltage is increased but only slightly until the device (the normally blocking junction $J_c$) breaks down and then appreciable current flows. The current gain then increases rapidly as the emitter current is increased.

The gate lead which may be connected to the internal P type conduction layer provides a very effective way of increasing the emitter current. That is to say that the emitter current is easily increased through transistor action by introducing current, $I_G$, at the gate lead. The mechanism for switching the device from its state of high impedance to its state of low impedance is well understood. As indicated above, it is also understood that the device may be switched from its on condition (its low impedance condition) by decreasing the current supplied to the base of either transistor section to such a low value that the center junction $J_c$ again becomes a blocking junction, i.e., unsaturated or reverse biased. This may be done by decreasing the voltage across the device until it can no longer support the necessary current flow.

Another mechanism for doing this is to extract current at the gate lead. This "drains" positive carriers from the internal P type base region and reduces the voltage across the emitter junction which in turn reduces the flow of negative carriers from the N type end region and effectively "starves" the junction $J_c$. The reduced flow of electrons across the junction $J_c$ into the internal N type region results in a reduced voltage across the junction which also reduces the flow of positive holes from the end P type emitter region. If the withdrawn gate current is large enough, the center junction $J_c$ returns to its normally blocking condition. This effect takes place in a very short time, e.g., a few microseconds. This latter mode of operation is not used in most PNPN semiconductor switches because the current which must be withdrawn in order to turn the device off approaches the normal conduction current of the device.

For an understanding of the way a practical gate turn off switch is built, reference is again made to the conceptual pair of transistors illustrated in FIGURES 1, 1B and 1C. Assume that the gate lead is connected to the central P type layer (base layer) of the NPN transistor (FIGURE 1C) and consider the situation when the device is conducting. A portion of the current through the device is supplied by the PNP transistor and the magnitude of this current is dependent upon its gain $\alpha_{pnp}$. If the PNP transistor section of the device supplies a current which is much greater than the current required to keep the "normally blocking center junction J," from becoming nonconductive, then it becomes very difficult to remove enough current at the gate lead to turn the device off. Actually, under these conditions the current withdrawn by the gate may not reach a sufficiently high value to turn the device off until it almost equals the device current itself. This suggests that the current gain of the PNP region should be reduced to the point that it supplies little if any more than just that current required to keep the center junction $J_c$ conductive when no gate current is flowing. This current limit requirement is met if the current gain of the device is made to approach zero.

It is well understood that the requirement for a device to turn on is that the sum of the current gains ($\alpha_{pnp}+\alpha_{npn}$) of the conceptual transistors approach unity. Thus, if the current gain of the PNP section of the device approaches zero then the current gain of the NPN section of the device should approach unity. A device which can readily be turned off results when the ratio of the current gain of the NPN transistor section to the current gain of the PNP section is about an order of magnitude or more.

A parameter often used to express the ease with which such devices can be turned off is called "turn off gain." "Turn off gain" may be defined as the ratio of current flowing in the load when the switch is on to the gate current required to turn the switch off. In one particular device, a load current of 600 milliamperes is turned off with an 8 milliampere gate current to provide a turn off gain of 75.

Pursuing this line of reasoning described above has led workers skilled in the art to suppress the current gain of one of the conceptual transistors ($\alpha_{pnp}$ in the illustrated device) in order to enhance the turn off gain. There are a number of ways to achieve this result but one of the best ways to restrict current gain of a three layer device is to limit the efficiency of one of the device emitters.

In carrying out the present invention a four layer GTO is provided in which the turn off gain capability is enhanced by reducing the emitter efficiency of the three layer section (conceptual transistor) which has a main terminal and the gating terminal connected to its opposite outer layers. The emitter efficiency of this conceptual transistor is reduced at least by providing a highly doped (low resistivity) layer like region in the internal layer immediately adjacent the external emitter layer and in one embodiment a shorting contact is provided between the low resistivity internal region and the external emitter layer.

The features which are believed to be characteristic of the invention are set forth with particularity in the appended claims. The invention itself, however, both as to its organization and advantages thereof may best be understood by reference to the following description taken in connection with the accompanying drawings in which:

Figure 2:
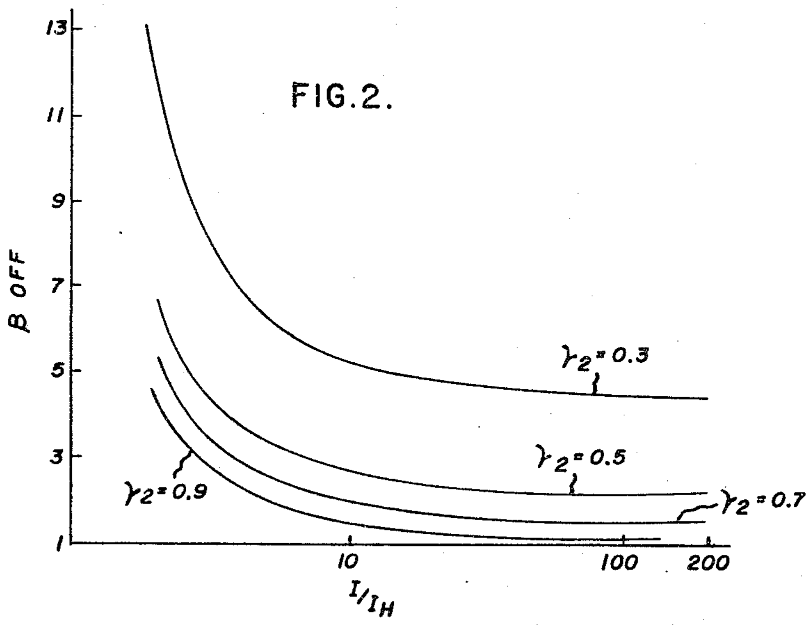

FIGURE 2 is a graph showing calculated values of turn off capability $\beta_{off}$ plotted along the axis of ordinates against the ratio of device current I to hold current $I_H$ plotted along the axis of abscissas for a number of values of emitter injection efficiency $\gamma_{E2}$, and FIGURES 3, 4, 5 and 6 illustrate diagrammatically embodiments of three terminal semiconductor switches composed of four layer semiconductor pellets and each constructed in accordance with teachings of the present invention.

Figures 1A, 1B, 1C:
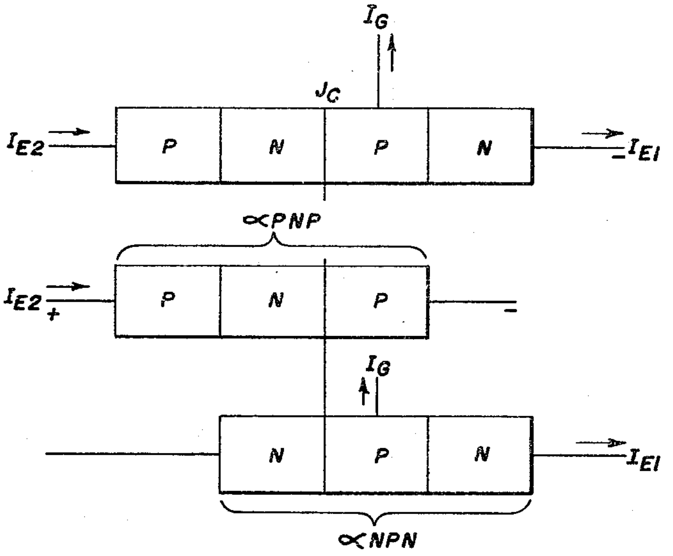
FIGURE 1A is a schematic representation of a four layer, three terminal PNPN switch used in the description and analysis of the present invention (including the above description)
FIGURES 1B and 1C are conceptual PNP and NPN transistors constructed from the four layer device of FIGURE 1A which are analyzed individually and superimposed in the above explanation of the concepts of the four layer switch used in the present invention.

In order to obtain a better understanding of the invention, a simple one dimensional analysis is given utilizing the typical four region PNPN structure schematically represented in FIGURE 1A. Before beginning the analysis, however, it should be recognized that a three terminal PNPN switch cannot be described accurately by a one dimensional model, except at very low current levels. Even so, the analysis provides considerable insight into the problems involved in both turning on and turning off such switches.

As pointed out above, the four zone, three terminal PNPN switch illustrated in FIGURE 1A has contacts fixed to the two end regions and a gate lead attached to one of the base layers (the internal P region as illustrated). Assume an external voltage applied across the switch which is positive at the end P region and negative at the end N region. For this polarity the current flows through the device as indicated by the arrows from the external P type region to the external N type region. The current flowing into the external P type region is designated as $I_{E2}$, the current flowing out from the external N type region is designated as $I_{E1}$ and the current flowing in the gate lead is designated as $I_g$. As above, the current gain for the PNP region is designated as $\alpha_{pnp}$ and the current gain for the NPN region is designated as $\alpha_{npn}$. If some leakage currents are neglected, the following equations can be written to describe the currents in the turned on device:

(1) $$I_{E2}\alpha_{pnp}-I_G=(1-\alpha_{npn})I_{E1}$$

(2) $$I_{E1}\alpha_{npn}=(1-\alpha_{pnp})I_{E2}$$

solving for $I_{E2}$ the following equation is obtained:

(3) $$I_{E2}=I_G\frac{\alpha_{npn}}{\alpha_{npn}+\alpha_{pnp}-1}$$

To determine the requirements for turning off the device, the device is considered to be in the conductive state with an external current to the load flowing which is determined principally by the magnitude of the external power supply voltage and the resistance of the load connected to the device. As was indicated previously, the center junction in the device, i.e., the junction between the internal N and P regions (labeled $J_c$) is a junction which normally opposes current flow in the direction indicated. When current is flowing, a voltage appears across the junction $J_c$ which is in a direction to maintain or substain current flow through the junction. In other words, the junction voltage changes from its blocking direction in the non-conduction state to "forward bias" in its conducting state. Thus, it is apparent that the voltage across this junction varies. By this mechanism, the current in the device and the current gains ($\alpha$'s) of the two sections of the device change. Once the device is conducting, the change of the $\alpha$'s is in a direction to supply exactly enough base current for each transistor section to maintain the current flow. If the current is removed from one of the bases the load current drops unless the current gains ($\alpha$'s) can readjust (increase) themselves.

For a given load current there is a maximum value possible for each of the $\alpha$'s. As the outflow of gate current is increased, the $\alpha$ of the NPN section (the section having the gate lead attached to its base) decreases until ($\alpha_{npn}+\alpha_{pnp}$) is less than one. At this point, the device switches to the off state.

To find the gate current $I_G$ required to turn off a given load current, $I_{E2}$, the $\alpha$'s are asumed to have their maximum values (for the currents $I_{E2}$ and $I_{E1}$). We assume that $I_{E2}$ has a minimum possible value $I_M$ with the gate current $I_G$ and $I_H$ is the holding current necessary to maintain the device in its on condition where $I_G=O$. We define turn off capability $\beta_{off}$ as a ratio of change in minimum hold current to the gate current $I_E$. This parameter is sometimes called turn off gain but, as previously indicated, for the present discussion turn off gain is defined as the ratio of load current to the gate current required to turn it off. The turn off capability parameter is considered important since it expresses the change in holding current $I_H$ at different levels of load current. The following equation defines turn off capability for the device:

(4) $$\beta_{off}=\frac{I_M-I_H}{I_G}=\frac{I_M}{I_G}\left(1-\frac{I_H}{I_M}\right)$$

Then substituting from Equation 3 above turn off capability (5)

(5) $$\beta_{off}=\left(\frac{\alpha_{npn}}{\alpha_{npn}+\alpha_{pnp}-1}\right)\left(1-\frac{I_H}{I_M}\right)$$

or if $I_M$ is much larger than $I_H$ (6) $$\beta_{off}=\frac{\alpha_{npn}}{\alpha_{npn}+\alpha_{pnp}-1}(I_M\gg I_H)$$

It turns out that this is precisely the expression which can be arrived at for turn off gain when starting with the definition given above. This, of course, is to be expected since the turn off gain definition initially ignores holding current $I_H$ and this expression is arrived at assuming the holding current term $$\left(\frac{I_H}{I_M}\right)$$

is negligible.

In general, the way that the $\alpha$'s vary as a function of current is unknown. Experiments indicate that it is possible to have both $\alpha$'s approach unity at moderate currents (as, for example, a result of fields developed by ohmic current flow). Under these conditions the turn off gain then also approaches unity. It is clear than that the turn off gain can be high if some means can be found to restrict one or both of the $\alpha$'s. For the expression above (Equation 6) it is clear that the better turn off gain is achieved if the $\alpha_{pnp}$ is restricted.

An inspection of the equation for the turn off gain (6) shows that the individual current gains $\alpha_{npn}$ and $\alpha_{pnp}$ should have a sum very nearly unity for maximum turn off gain and that the turn off gain can be high if a means is found to restrict one or both of the individual current gains ($\alpha$'s). Since the $\alpha_{npn}$ appears in the numerator (for the device structure illustrated) it becomes apparent that maximum effect will be obtained if $\alpha_{pnp}$ is the one which is suppressed. A consideration of these equations also shows that in order for a PNPN or NPNP device to exhibit a switching characteristic (from high to low impedance) the current gain ($\alpha$) of at least one section of the device must increase with current. That is to say, that since the sum of the $\alpha$'s of the section must be greater than one to exhibit turn on gain and since the sum of the $\alpha$'s must be less than unity in order to have turn off gain it is apparent that at least one component transistor structure must have an $\alpha$ which varies with current if both turn on and turn off gain are to be exhibited.

One approach to enhance the turn off gain of the device which follows is to suppress the one current gain ($\alpha_{pnp}$) so that its maximum value is near zero (e.g. 0.1 or less) and adjust the other current gain so that it rapidly increases with load current to a value as near unity as possible. It is recognized that the current gain $\alpha$ of a four layer PNPN switch is basically composed of two parameters vis: $\gamma$ the emitter efficiency and T, the transport factor. $\alpha$ is simply the product of these two quantities, that is (7) $$\alpha=\alpha T$$

Now $\gamma$ is principally determined by the relative impurity concentration of the layers on opposite sides of the junction considered and for not too high or too low injection levels is given by the following equation:

(8) $$\gamma=\frac{1}{\dfrac{1+\sigma_B W_B}{\sigma_E L_E}}$$

where $L_E$ is the diffusion length for minority carriers on the emitter side of the junction, $W_B$, is the base width, $\sigma_B$ and $\sigma_E$ are conductivities of the base and emitter regions respectively. The emitter width $W_E$ may be substituted for the diffusion length $L_E$ in the case of the present invention since emitter width will normally be less than a diffusion length.

Now consider the means of restricting the current gain $\alpha$. One means of restricting one of the $\alpha$'s, for example, $\alpha_{pnp}$, is to make emitter efficiency $\gamma_{E2}$ of the PNP section low (consider Equation 7). A way to illustrate this effect is shown in FIGURE 2 of the drawings where a calculated value for turn off capability $\beta_{off}$ is plotted along the axis or ordinates as a function of the ratio of device current to holding current, $I/I_H$ (plotted along the axis of abscissas for several values of emitter injection efficiency $\gamma_{E2}$). For this purpose, $\alpha_{npn}$ is assumed constant at $0.9\alpha_{pnp}$ is assumed to have the form:

(9) $$\alpha_{pnp}=\gamma_{E2}\exp\,(=I_O/I)$$

where $I_O$ is the current at which the device turns off. The hold current $I_H$ as obtained for the condition $$\alpha_{npn}+\alpha_{pnp}=1$$

is

(10) $$I_H=\frac{I_o}{\dfrac{1n\ \gamma_{E2}}{1-\alpha_{npn}}}$$

so that

(11) $$\alpha_{pnp}=\gamma_{E2}\exp\left[-I_H\frac{1n\left(\dfrac{E2}{l-\alpha_{npn}}\right)}{1}\right]$$

Notice that the form for $\alpha_{pnp}$ is assumed. This assumption is not necessarily generally accepted but it is generally accepted that the $\alpha$ varies roughly exponentially with emitter current. The curves illustrate that for high values of injection efficiency, $\gamma$, the turn off gains are low. Further, the turn off gain for a given injection efficiency decreases as the current increases but levels off at some substantially minimum value for each emitter injection efficiency.

Now to the point of reducing the current gain. From Equations 7 and 8 respectively, it is seen that the current gain is directly proportional to emitter efficiency $\gamma$ and the emitter efficiency is a function of the conductivity of both the base $\sigma_B$ and the emitter $\sigma_E$. The emitter efficiency decreases as the ratio of the base to emitter conductivity increases, and as has been previously pointed out, turn off gain increases as emitter efficiency decreases. The present invention contemplates reducing the emitter efficiency of the conceptual transistor portion of the device which has the gate lead connected to one of its external layers and at the same time providing a desired high device forward breakover voltage for turn on. This is accomplished by providing a region of high conductivity and a region of low conductivity in the base region of the portion of the device under consideration. The emitter efficiency is reduced by providing a region of high conductivity contiguous with the junction between the base layer and external layer connected to a main anode or cathode lead. The forward breakover voltage characteristic is imparted by the high resistivity region in the base.

Semiconductor switching devices (GTO's) constructed in accordance with the principles of the present invention are illustrated in each of FIGURES 3 through 6 inclusive. In each of these figures, the GTO is given the reference numeral 10 and is provided with three leads 11, 12 and 13 which are intended to be connected in the circuit where the GTO is employed. In each case, the main current carrying terminals, the anode 11 and cathode 12, and the gate terminal 13 are given like reference numerals. The main terminals 11 and 12 are connected in a main current carrying path of the circuit where the GTO is used in such a way that the anode terminal 11 is positive relative to the cathode terminal 12. The gating terminal 13 is connected to a source which supplies a turn-on signal when the current path between the main terminals 11 and 12 is to be rendered highly conductive (turned on) and a turn off signal when the internal current path between the main terminals 11 and 12 is to be rendered high impedance (turned off).

Figure 3:
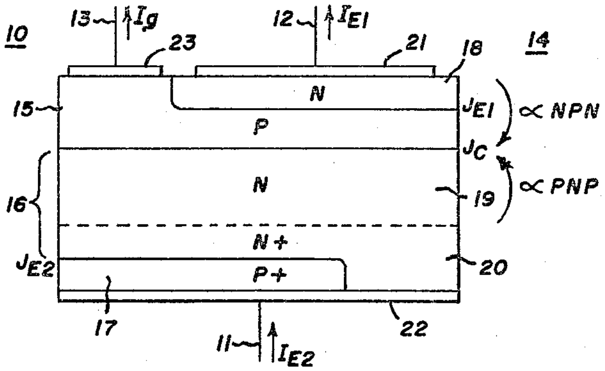

As illustrated in FIGURE 3, GTO 10 includes a single monocrystalline semiconductor pellet 14 which is composed of four layers of opposite conductivity type. The pellet 14 includes internal P and N type layers 15 and 16 respectively, which extend across the entire pellet and form the center junction $J_c$ between them a lower P type layer 17 which is formed in lower surface of the internal N type layer 16 and extends only part way across the pellet 14 and an external N type layer 18 at the upper surface of pellet 14 formed in the internal P type layer 15 in such a manner that an edge protrudes over an edge of the P type layer 17 on the opposite outer surface. The boundary between upper N type external layer 18 and internal P type layer 15 defines upper emitter junction $J_{E1}$ and the boundary between lower P type external layer 17 and internal N type base layer 15 defines the lower emitter junction $J_{E2}$. In order to provide the desired device characteristics the internal N type layer 16 is composed of two layer like regions 19 and 20. The upper region 19 is of a relatively high resistivity N type material and is contiguous with center junction $J_c$. The lower region 20 of N type layer 16 is composed of a relatively low resistivity N type material (hence the N+ designation) and is contiguous with lower emitter junction $J_{E2}$. The resistivity (inverse of conductivity) of the lower region 20 of the N type base layer 16 is selected so as to provide a desired emitter efficiency for the lower PNP section of the device as previously described.

The boundary between the two regions 19 and 20 of layer 16 can be referred to as a juncture rather than a junction. Here the term juncture is used to describe a marked transition or boundary between materials of different resistivity regardless of conductivity types whereas a junction is used to describe the boundary between materials of different conductivity type.

In order to provide a means for connecting the appropriate layers of pellet 14 in the circuit to perform the function of a GTO, ohmic contacts 21, 22 and 23 are provided. Ohmic contact 21 is connected to the upper N type layer 18 and provides an electrical connection for the device cathode lead 12. On the bottom surface of pellet 24, ohmic contact 22 shorts the lower P type layer 17 to the low resistivity region 20 of internal N type layer 16 and is connected directly to the anode lead 11. An ohmic contact 23 is provided on the internal P type layer 15. This contact (23) is connected directly to the gate lead 13.

One method of forming a practical device of the type illustrated in FIGURE 3 is to start with a silicon pellet about 6 mils thick and of N conductivity type with a resistivity of around 20 ohm-centimeters (impurity concentration of about $2.7\times10^{14}$ atoms per cc.). This material ultimately forms the upper region 19 of the internal N type layer 16. The pellet 14 is gallium or boron diffused to a depth of about 2 mils so that P type conductivity layers are formed on both sides of the N type material with a surface concentration of approximately $10^{18}$ atoms per cc. The P type layer on one side forms the internal P type layer 15 to which the gate lead 13 is connected. After this diffusion, one layer of P type material is completely removed by lapping or etching to leave a two layer PN pellet with the center junction $J_c$ formed therein. The pellet is masked by conventional masking techniques and phosphorous diffused at the upper surface to a depth of about 1 mil to form the upper N type emitter layer 18 and hence, the upper emitter junction $J_{E1}$ of the configuration illustrated in FIGURE 3. This diffusion provides a surface concentration of approximately $10^{21}$ atoms per cc. An N+ layer which forms the region 20 of internal N type layer 16 is deposited on the lower surface of the pellet to a depth of approximately 1 mil and provides an average impurity concentration of approximately $5\times10^{18}$ atoms per cc. in this region. It will be noted that this impurity concentration is considerably higher than the impurity concentration for the region 19, and therefore, the resistivity is considerably lower.

Since the emitter efficiency aimed for in the lower PNPN section of the device is controlled by the ratio of conductivities of the N+ region 20 and the adjacent P type emitter layer 17 immediately adjacent the junction $J_{E2}$, the lower P type layer is preferably formed by epitaxy. In order to obtain the structure illustrated in FIGURE 3, a depression or "well" can be etched out of the lower N+ region 20 and the P+ material which forms the layer 17 may be epitaxially deposited. With the concentrations and dimensions described, the average impurity concentration in the lower P type layer 17 should be approximately $5\times10^{17}$ atoms per cc. A practical device results if the ratio of impurity concentration is adjusted so that the concentration in the N+ region 19 is at least five times greater than that of the P+ layer 17. The ohmic contacts may be placed on the device by conventional means.

In the structure illustrated in FIGURE 3, the turn off gain of the device is enhanced by reducing the current gain of the lower three layer portion of the device, i.e. $\alpha_{pnp}$, by the mechanism of reducing the lower emitter efficiency. This reduction in emitter efficiency is accomplished by providing the relatively low resistivity region 20 immediately adjacent the emitter layer 17 and further enhanced by provision of the emitter shorting contact 22. It is to be particularly noted that the material in region 20 is not degenerate, thus, tunneling is avoided. Further, a reasonable device breakover voltage is maintained by the provision of the relatively high resistivity N type region 19 and N type layer 16.

Figure 4:
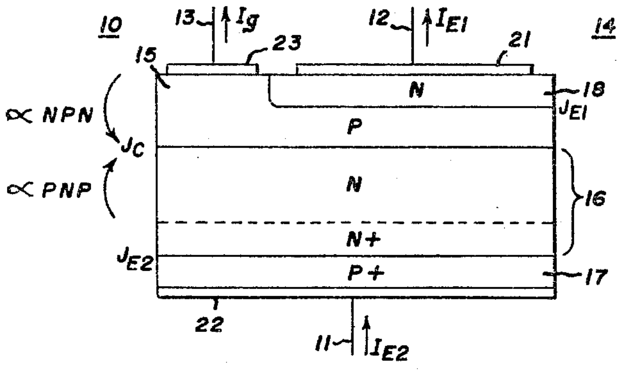

In the structure of FIGURE 4, a shorted emitter is not provided. This frequently is not necessary or desirable since the use of both conductivity adjustment and an emitter short may lower the current gain of the lower section of the device to such an extent that the device is difficult to turn on. Possibly of more importance is the fact that the use of a shorted emitter increases the device holding current (i.e. increases the minimum current required to keep the device conductive). However, aside from the fact that it does not have a shorted emitter, the structure of FIGURE 4 is essentially the same as the structure of FIGURE 3 and may have the same dimensions and impurity concentrations as for corresponding parts of the structure of FIGURE 3. As a consequence, corresponding parts of the two figures are given identical reference numerals and characters.

Figure 5:
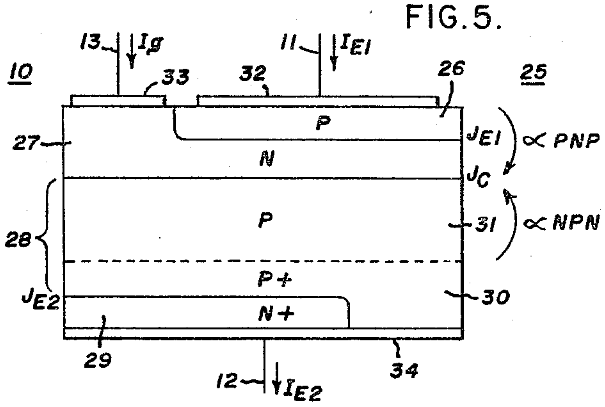
Figure 6:
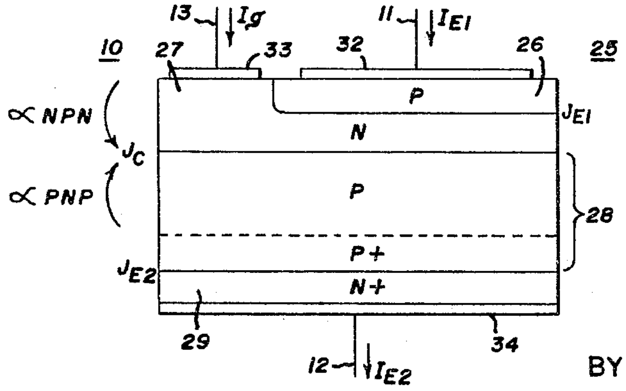

FIGURES 5 and 6 are shown to illustrate that the invention applies equally well to the exact duals of the devices illustrated in FIGURES 3 and 4. That is to say, that the invention applies equally well where P type layers are directly substituted for N type layers and vice versa.

For example, the device of FIGURE 5 is an exact dual of the structure illustrated in FIGURE 3. In the device of FIGURE 5 the monocrystalline semiconductor pellet has four layers of PNPN conductivity types respectively. The upper P type layer 26 forms the upper emitter layer. This layer is formed in the next adjacent internal N type layer 27 in such a manner that it extends only part way across the pellet and forms a junction $J_{E1}$ between the two layers. The internal N type layer 27 is immediately adjacent internal P type layer 28 and the device center junction $J_c$ is defined at the boundary between these two layers. The lower N type emitter layer 29 is formed in the internal P type layer 28 and the lower emitter junction $J_{E2}$ is defined at the boundary between the two layers. Again, the portion of the internal layer 28 which is immediately adjacent the lower emitter layer 29 is formed of a relatively low resistivity region 30 which borders the lower emitter junction $J_{E2}$ and a relatively high resistivity region 31 which is adjacent the center junction $J_c$.

In order to provide a connection for the anode lead 11 an ohmic contact 32 is formed on the upper P type emitter 26. The connection for the gate lead 13 is provided by an ohmic contact 33 formed on the internal N type base region 27, and the lower surface of the device is provided an ohmic contact 34 which extends across the lower N type emitter layer 29 and a portion of the low resistivity P type region 30 of the internal P type base layer 28. This ohmic contact provides a means for connecting the cathode lead 12 to the device.

The low resistivity and high resistivity P type regions 30 and 31 respectively of the internal P type base layer 28 and the shorted ohmic contact 34 perform the same functions in essentially the same way as do their duals in the device of FIGURE 3. Consequently, it is believed that further discussion of the function of these parts and the operation of the device is not warranted or necessary. However, it should be noted that the dimensions of the corresponding (dual) layers and relative impurity concentrations of these layers should be the same for both devices.

For example, the upper P type emitter layer 26 of the device of FIGURE 5 should be approximately 1 mil thick and have a surface impurity concentration of approximately $10^{21}$ atoms per cc. as does its dual layer (upper N type emitter layer 18) of the device of FIGURE 3. Thus, internal N type base layer 27 of the device of FIGURE 5 should have a thickness between upper emitter junction $J_{E1}$ and the center junction $J_c$ of about .8 to 1 mil and its surface concentration should be about $10^{18}$ atoms per cc. The internal P type high resistivity region 31 of internal P type base layer 28 may be approximately 2 mils thick and have an average impurity concentration of approximately $2.7 \times 10^{14}$ atoms per cc. and the low resistivity region 30 of the layer may have a thickness between the internal juncture and lower emitter junction $J_{E2}$ of about 1 mil with an impurity concentration of $5 \times 10^{18}$ atoms per cc. The lower N type emitter layer 29 is approximately 1 mil in thickness and has an impurity concentration of about $5 \times 10^{17}$ atoms per cc.

The structure of FIGURE 6 corresponds to the structure of FIGURE 5 except that the lower N type emitter layer of FIGURE 6 extends all the way across the lower surface of the device and the emitter contact 34 does not provide a short to the low resistivity P type region in the internal P type base layer 28. The shorted emitter is eliminated for the same reasons discussed in connection with the structure of FIGURE 4. In fact, it will be recognized that the structure of FIGURE 6 is the exact dual of the structure of FIGURE 4. Since the structure of FIGURE 6 corresponds so closely to that of FIGURE 5 and further, since it operates in the same manner, the corresponding parts of the two structures are given identical reference numerals. The dimensions of the corresponding parts of the two devices are identical and the impurity concentrations of the corresponding layers in the two devices are identical. For this reason, further discussion of the structure of FIGURE 6 is not believed to be warranted or necessary.

While particular embodiments of the invention have been shown, it will, of course, be understood that the invention is not limited thereto since many modifications in the arrangements and instrumentalities employed may be made. It is contemplated that the appended claims may cover any such modifications as fall within the true spirit and scope of the invention.

What we claim as new and desire to secure by Letters Patent of the United States is:

1. A semiconductor switching device adapted to be connected in a main current conducting path and switched between high and low impedance modes including in combination (A) three terminals including
  (a) a pair of main terminals adapted to be connected in a main current carrying path
  (b) a gating terminal for switching the semi-conductor switching device between its high and low impedance states, (B) monocrystalline semiconductor pellet including
  (a) four layers of opposite conductivity type arranged in succession thereby defining first, second, third, and fourth layers successively with said first and fourth layers forming external layers and said second and third layers comprising internal layers.
    (1) contiguous layers being of opposite conductivity type thereby defining three internal PN junctions
    (2) said third internal layer comprising a composite layer including two layer-like regions of like conductivity type and high and low resistivity material respectively each extending across the entire area of the said semiconductor pellet and thereby defining a continuous uninterrupted internal juncture in said layer
      (i) said low resistivity region being contiguous with said fourth layer (the next adjacent external layer)

(C) ohmic contact to said first and fourth layers and each connected to one of said pair of main terminals so that the four layers are in the main current conducting path of the switching device, (D) an ohmic contact to said second layer connected to said gating terminal whereby the switching device can be selectively switched between high and low impedance modes in response to signals at said gating terminal.

2. A semiconductor switching device of the type defined in claim 1 wherein the said ohmic contact to said fourth layer also contacts the low resistivity region of said third layer.

3. A semiconductor switching device of the type defined in claim 1 wherein said first, second, third and fourth layers are NPNP conductivity type respectively.

4. A semiconductor switching device of the type defined in claim 3 wherein said ohmic contact to said fourth layer also contacts the said layer like region of low resistivity of said third layer.

5. A semiconductor switching device of the type defined in claim 1 wherein said first, second, third and fourth layers are of PNPN conductivity types respectively.

6. A semiconductor switching device of the type defined in claim 5 wherein said ohmic contact to said fourth layer also contacts the said layer like region of said third layer which is of low resistivity material.

References Cited

UNITED STATES PATENTS

| | | | |
|---|---|---|---|
| 2,993,154 | 7/1961 | Goldey et al. | 317—235 |
| 3,079,512 | 2/1963 | Rutz | 317—235 |
| 3,211,971 | 10/1965 | Barson et al. | 317—235 |
| 3,239,728 | 3/1966 | Aldrich et al. | 317—235 |
| 3,249,831 | 5/1966 | New et al. | 317—235 |

OTHER REFERENCES

"Turn-Off Gain p-n-p-n Triodes," by J. M. Goldey, I. M. Mackintosh and I. M. Ross, appearing in Solid State Electronics, 1961, vol. 3, pp. 119–122.

JOHN W. HUCKERT, *Primary Examiner.*

D. O. KRAFT, M. EDLOW, *Assistant Examiners.*